United States Patent [19]

Cuppens et al.

[11] Patent Number: 4,603,402
[45] Date of Patent: Jul. 29, 1986

[54] SEMICONDUCTOR DEVICE

[75] Inventors: Roger Cuppens; Cornelis D. Hartgring, both of Eindhoven, Netherlands

[73] Assignee: U.S. Philips Corporation, New York, N.Y.

[21] Appl. No.: 677,639

[22] Filed: Dec. 4, 1984

[30] Foreign Application Priority Data

Dec. 9, 1983 [NL] Netherlands ............ 8304256

[51] Int. Cl.$^4$ .................................... G11C 11/40
[52] U.S. Cl. .................................... 365/182; 365/189; 365/230
[58] Field of Search ............. 365/182, 185, 189, 230

[56] References Cited

U.S. PATENT DOCUMENTS

4,541,006 9/1985 Ariizumi et al. ............ 365/182

Primary Examiner—Terrell W. Fears
Attorney, Agent, or Firm—Robert T. Mayer; Steven R. Biren

[57] ABSTRACT

The invention relates to an EPROM or an EEPROM in which the information is stored in the form of electrical charge above the channel region of a MOST, as a result of which the threshold voltage of the MOST is determined by the stored information. Writing/erasing of the memory generally requires high voltages to cause charge current to flow through an insulating layer to and from the charge storage region. In order to avoid having the parasitic MOSTs becoming conductive, means are provided by which during operation a small reverse bias is applied to the sources of these parasitic transistors, as a result of which due to the high k factor the threshold voltage of the parasitic transistors increases considerably. This does not require additional logic because use can be made of the generator in the reading circuit, which generates a suitable small voltage.

6 Claims, 11 Drawing Figures

SEMICONDUCTOR DEVICE

BACKGROUND OF THE INVENTION

The invention relates to a semiconductor device comprising a semiconductor body which is provided at a surface with a non-volatile memory of a type in which each memory cell comprises an insulated-gate field-effect transistor, whose threshold voltage, which depends upon the stored information, is determined by electrical charge that can be stored in a charge storage region which is defined in an insulating layer covering the channel region. This transistor further includes a gate electrode capacitively coupled to the charge storage region and source and drain zones of a first conductivity type which are separated by a pn junction from a layer-shaped part of the semiconductor body of the second conductivity type surrounding the zones, means being provided for applying a given voltage, for example a supply voltage, to the layer-shaped part of the semiconductor body during operation, and means being provided for applying between the gate electrode and a conductive region adjoining the oxide layer, during erasing and/or writing (for example, a part of the semiconductor body located under the charge storage region and hereinafter designated the substrate region), a voltage difference such that an electrical field is produced across the insulating layer whereby charge flow can occur between the charge storage region and the conductive region/substrate region.

Memories of the kind mentioned here, generally designated as EEPROMs or E$^2$PROMs and EPROMs, are programmable memories which can be erased electrically or by means of (UV) radiation and can then be electrically reprogrammed. In a frequently-used construction, the charge storage region is constituted by a floating gate electrode which is embedded in the insulating layer above the channel region. The said gate electrode may be formed on the insulating layer or may be located in the semiconductor body in the form of a diffused zone. The conductive region is mostly constituted by a region in the substrate. In particular embodiments, the conductive region may also be constituted by a conductive layer which is located above the floating gate.

The cell may be written into (programmed) and erased by quantum tunelling of electrons through the insulating layer. Such a semiconductor device is described inter alia in U.S. Pat. No. 4,377,857. In another embodiment, in which the charge storage region consists of a floating gate electrode, the operation of programming/erasing is effected by injection of hot charge carriers which are generated in the semiconductor body by avalanche breakdown. In a further embodiment, the charge storage region can be constituted by the interface layer between two different dielectrics, such as silicon dioxide and silicon nitride. Such memories are often designated as MNOS memories.

In embodiments having a floating gate, the layer-shaped part of the semiconductor body mentioned above can cover the whole semiconductor substrate, which in this case, apart from the zones formed in it, can be mainly of the second conductivity type. In the case of an MNOS memory, the layer-shaped part of the semiconductor body can comprise a pocket (or well) formed in a semiconductor substrate of the one conductivity type by means of so-called C-MOS technology.

For the sake of simplicity, the following description will relate to memories having a floating gate, in which the operation of writing/erasing is effected by tunnelling. However, it should then be noted that, because problems similar to those described for this type of EEPROM may also arise for other types of EEPROMS and EPROMS, the invention can also be used in these other types.

In memories based on the quantum tunnelling mechanism, the oxide above the drain zone has been locally made very thin, for example a few tens of Angström units. A high voltage can be applied to the gate electrode, whereas a low voltage, especially substrate voltage or ground potential, is applied to the drain. Between the floating gate (which is capacitively strongly coupled to the gate electrode) and the drain zone (which constitutes the substrate region mentioned in the opening paragraph) there is produced such a strong electrical field that (in the case of an n-channel MOST) it is possible for electrons to tunnel from the drain region via the thin oxide to the floating gate. By inversion of the field, a tunnel current in the opposite direction can be obtained. Thus, it is possible to write and erase a cell.

The gate electrodes, which are interconnected by word or data lines, extend not only above the channel regions, but also above the field oxide between the memory cells and can form a parasitic field effect transistor, in which the field oxide is the gate dielectric and the said drain of the memory transistor is the source. When the threshold voltage is lower than the said high voltage which during writing or erasing is applied to the gate electrode, this transistor becomes conducting. This problem could be solved by the use of a process in which high voltages are permissible without parasitic thresholds being exceeded. However, nowadays it is often desirable to integrate EEPROMs together with VLSI circuits, such as, for example, in microprocessors, because this allows the user to adapt the systems in a simple manner. The usual VLSI processes are optimized for applications which use low voltages (smaller than 10 V). As a result, problems can arise when programming the (E)EPROMs, which require a higher voltage, for example about 20 V. In general, a small current is required for programming the floating gates by means of tunnelling. Therefore, the high programming voltage can be generated internally by a charge pump, which in general can supply only a limited current. When the threshold voltages of the parasitic transistors are exceeded, as a result of which these transistors become conducting, as described above, leakage paths can be formed in the circuit, which limit the maximum voltage supplied by the pump. Additionally, other disadvantages due to parasitic transistors may occur.

This leakage path could be eliminated by replacing the material of the gate electrode at the critical areas (mostly polycrystalline silicon or poly) by another material, for example, a metal. Further, the threshold voltage of the parasitic MOS transistors may be increased by increasing the doping concentration under the field oxide. A further solution could consist of providing a conductive screening layer under the gate electrode connections, to which a low voltage can be applied. These solutions can be used for the peripheral electronics but are not practical for the storage matrix itself because they occupy an excessively large amount of space.

SUMMARY OF THE INVENTION

The invention has inter alia for its object to prevent the formation of parasitic channels substantially without process modifications and/or substantially without additional loss of space with regard to the cells. The invention is based inter alia on the recognition of the fact that it is possible to increase the threshold voltage of the parasitic transistors by means of circuit techniques due to the fact that for parasitic transistors the so-called K factor (body factor), which defines the influence of the substrate voltage on the threshold voltage, is very high.

According to the invention, a semiconductor device of the kind described above is characterized in that further means are provided by which during erasing and/or writing such an at least substantially constant voltage is applied to at least one of the source and drain zones of each transistor that the pn junctions between that zone and the layer-shaped part of the semiconductor body is reverse biased during the whole erasing or writing cycle, as a result of which the formation of parasitic channels adjoining these zones is prevented, this voltage across the said pn junction being much lower than the said voltage difference which is applied between the gate electrode and the conductive region/substrate region for producing a charge current between the charge storage region and the conductive region/substrate region.

In a simple preferred embodiment, during erasing and/or writing, the reading voltage is applied to the said zones which are mostly constituted by the drain zone of the transistor in floating gate memories. Generally, for reading, a low drain voltage (properly a source/drain voltage) is used in order to maintain the charge stored at the floating gate and to prevent it from flowing back to the drain by tunnelling. As a result of the application of this comparatively low voltage to the drain, the overall erasing and/or writing voltage is slightly lower as compared with the usual method of erasing and/or writing, in which the drain is also connected to ground; however, due to the fact that the threshold voltage of the parasitic MOST, as will be explained with reference to the description of the Figures, is increased to a considerably greater extent due to the high K factor, the formation of parasitic channels is prevented, as a result of which ultimately the voltage generated by the internal charge pump can be higher. This advantage is moreover obtained solely by a simple measure of circuit techniques, without any technological modification which would require either process adaptations or an additional amount of space.

BRIEF DESCRIPTION OF THE DRAWINGS

An embodiment of the invention will now be described more fully, by way of example, with reference to the accompanying diagrammatic drawing, in which.

It should be noted that FIGS. 1-4 are schematic and are not drawn to scale.

DESCRIPTION OF THE PREFERRED EMBODIMENTS

FIGS. 1-4 show in plan view and in cross-section, respectively, a part of an electrically erasable non-volatile memory of a type to which the invention relates. The device comprises a semiconductor body 1, which in the case in which a NMOS technology is used is made entirely of p-type silicon. In the case in which a C-MOS technology is used, the semiconductor body can be mainly of the n-type, while a layer-shaped part 1 adjoining the surface 2 has been rendered locally p-conducting by redoping to form a p-type pocket or well.

In addition to the memory, further circuits or circuit parts can additionally be integrated in the semiconductor body, such as, for example, a microprocessor or speech-processing circuits. However, the device can also consist solely of a memory comprising a memory matrix and the associated peripheral circuits.

Figure 1:
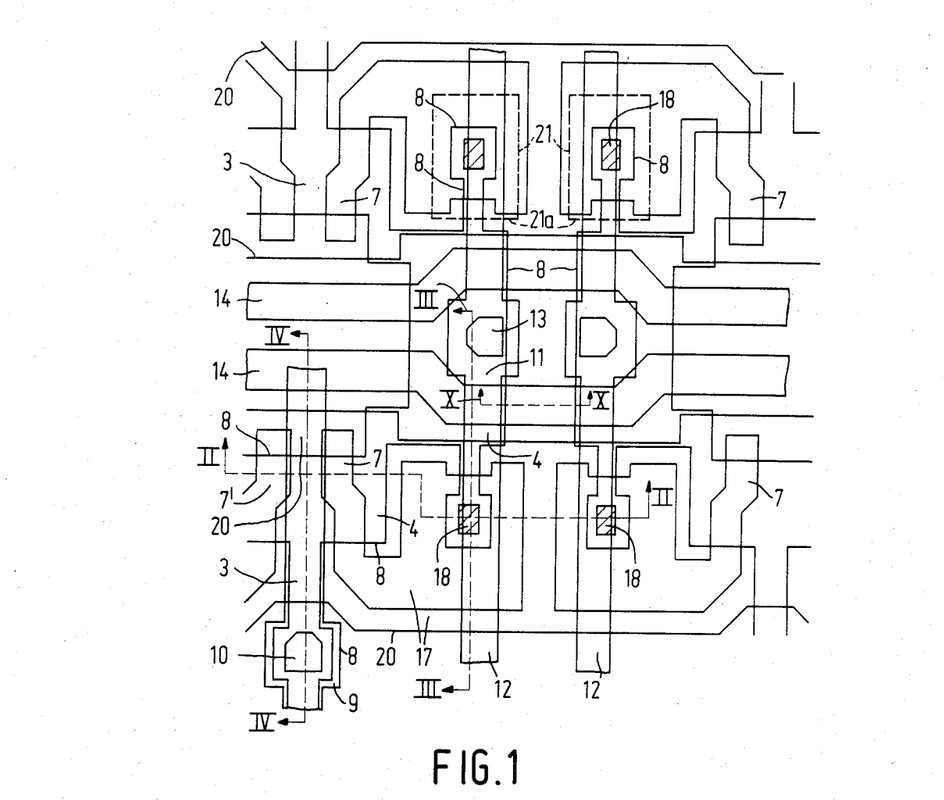
FIG. 1 is a plan view of a part of a memory of a type to which the invention relates.

The storage cells, of which only four are shown entirely in FIG. 1, each comprise an insulated gate (MOS) field effect transistor having a floating gate electrode, at which, depending upon the information that has to be stored, electrical charge can be provided, which determines the threshold voltage of the transistor. These transistors $T_1$, of which one is shown in sectional view in FIG. 2, comprise an n-type source zone 3, an n-type drain zone 4 and a channel region 5 located between the source and drain zones. The channel region 5 is covered by an insulating oxide layer 6, in which the floating gate 7 is defined, which is surrounded by oxide on all sides. The thickness of the oxide layer 6 between the floating gate 7 and the channel region 5 is about 50 nm (500 Å). The gate electrode 7 is made in a usual manner of doped polycrystalline silicon (so-called "polysilicon" or "poly"), but may of course also be made of a suitable metal or a silicide.

Figure 2:
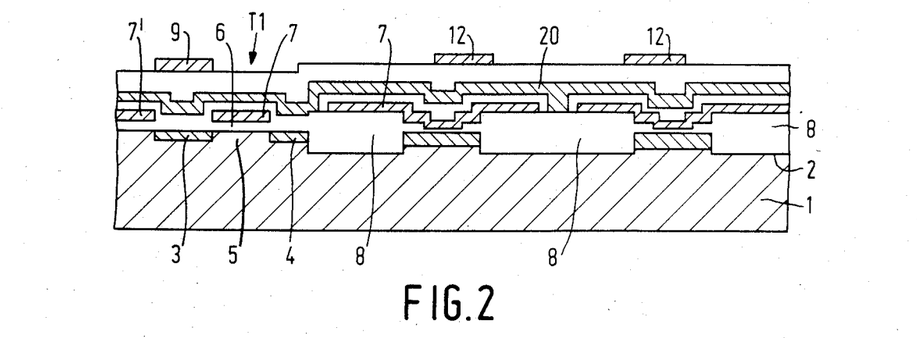
FIG. 2 is a sectional view taken on the line II—II in FIG. 1.

The source zone 3 of the transistors $T_1$ is common to two adjacent columns in the matrix and consequently also constitutes the source zone of a memory transistor in the column on the lefthand side of $T_1$, of which the floating gate 7' is indicated on the far left in FIG. 2. The drain zone 4 adjoins along part of its periphery a pattern 8 of comparatively thick field oxide, whose thickness is about 500 nm.

Figure 3:
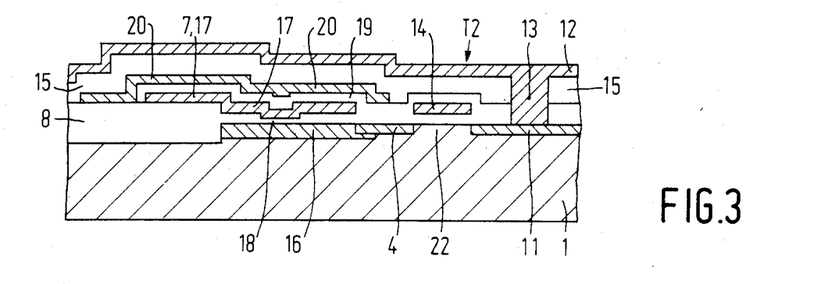
FIG. 3 is a sectional view taken on the line III—III in FIG. 1.
Figure 4:
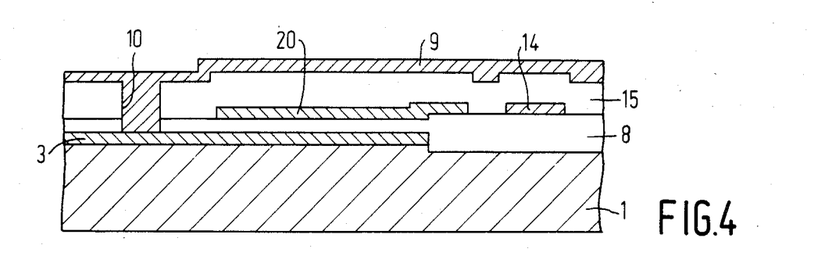
FIG. 4 is a sectional view taken on the line IV—IV in FIG. 1.

The source zone 3 (see FIGS. 1 and 4) is constituted by an elongate zone, which is limited by a part of the field oxide 8 limiting the channel 5. The source zones 3 of the cells located in one column are connected to the conductor track 9 provided on the oxide layer 15 via the contact window 10 in the thick oxide layer 15 obtained by CVD. The drain zone 4 is connected in series with a second MOS transistor $T_2$, whose source region coincides with the drain region of $T_1$. The drain region of $T_2$ is constituted by the n-type zone 11, which is contacted via a contact window with the Al bit/reading line 12 (FIGS. 1 and 3). As appears from FIG. 1, the zone 11 and the contact 13 are common to two adjacent cells in the same column. The channel region 22 is defined between the zones 4 and 11. The gate electrode of the transistor $T_2$ is constituted by the word line 14, which can be manufactured from the same polycrystalline silicon layer as the floating gate 7 (poly 1).

The drain zone 4 is at the same time connected to the n-type surface zone 16 (FIG. 3) which is provided under a prolonged part 17 of the floating gate 7. There is locally provided between the part 17 and the zone 16 an oxide layer 18, which is so thin that, when an electrical field is applied between the gate 7 and the zone 4, 16, electrons can tunnel through the layer 18. In the present embodiment, the thickness of the tunnel oxide 18 is about 8 nm (=80 Å). In FIG. 1, the regions 18 of the tunnel oxide are indicated by cross-hatched lines. These regions are as small as possible in order to limit to a minimum the possibility of undesired shortcircuits between the floating gate 7, 17 and the subjacent semiconductor body. The tunnel oxide 18 is limited by thicker oxide (FIG. 3), which may have approximately the same thickness as the gate oxide 6, i.e. about 500 Å.

The floating gate 7 and the part 17 are covered by an insulating oxide layer 19 and are capacitively coupled to a gate electrode 20. This gate electrode can be constituted by a surface zone which is provided in the semiconductor body 1 and which is overlapped by the gate 7, 17 and is provided with an electrical connection. In this case, monolayer polycrystalline silicon is sufficient. In the present embodiment, however, the gate electrode 20 consists of a conductive layer, which is provided in the form of a second polycrystalline layer (poly 2) above the floating gate parts 17 and is separated therefrom by the oxide layer 19. Each gate electrode 20 extends parallel to the word line 14 over the memory matrix and is common to a number of cells, for example eight cells.

The device described here can be manufactured by means of techniques known per se. The starting material is a p-type silicon substrate 1 having a doping concentration of about $10^{15}$ atoms/cm$^3$. The field oxide pattern 8, which defines the active and inactive regions, is provided by local oxidation, if desired after a p-type channel stopper implantation, as a result of which the boron concentration is increased under the field oxide. In a next step, the gate oxide 6 having a thickness of about 500 Å (50 nm) is provided in the regions not covered by the field oxide 8 on the surface 2 by thermal oxidation. At the areas at which the tunnel oxide 18 has to be formed, the gate oxide is removed again and is replaced by the 80 Å (8 nm) thick tunnel oxide 18. Subsequently, the n-type zones 16 are provided with the use of a separate mask by means of a phosphorus implantation. The mask used for this purpose comprises a pattern in a photolacquer layer having openings around the tunnel oxide regions 18. In FIG. 1, only two of these openings 21 are indicated by broken lines for the two upper cells; it will be appreciated that for the other cells the n-type zones 16 are defined in an analogous manner. The zones 16 are defined for the major part by the field oxide pattern 8 so that the mask 21 can be provided with a fairly large alignment tolerance because most of the edges of the lacquer mask are still located above the thick field oxide. Of all the edges of the mask 21, only the edge 21a defines the extent of the zone 16. However, since at a later stage the whole region between the field oxide edge and the word line 14 is redoped, the location of the edge 21a is not critical.

After the gate oxide 6, the tunnel oxide 18 and the n-type zone 16 have been provided, the first polycrystalline silicon layer is provided, in which the floating gate electrodes 7, 7' with the parts 17 and the word line 14 are formed in known manner. Subsequently, the source and drain zones of the field effect transistors are provided in a self-registered manner by means of the known so-called "silicon gate" technique.

The electrodes 7, 17 and the word lines 14 are coated with an insulating oxide layer either by means of thermal oxidation or by deposition from the gaseous phase. The oxide layer 6 in the parts of the active regions not covered by poly of course also increases in thickness.

Then the second polycrystalline silicon layer is provided, from which the gate electrodes 20 are formed by etching. Subsequently, the thick oxide layer 15 is provided by deposition from the vapor phase. After etching the necessary contact windows, an Al layer is provided by vapor deposition or sputtering, from which the Al tracks 9 and 12 are formed by methods known per se.

Figure 5:
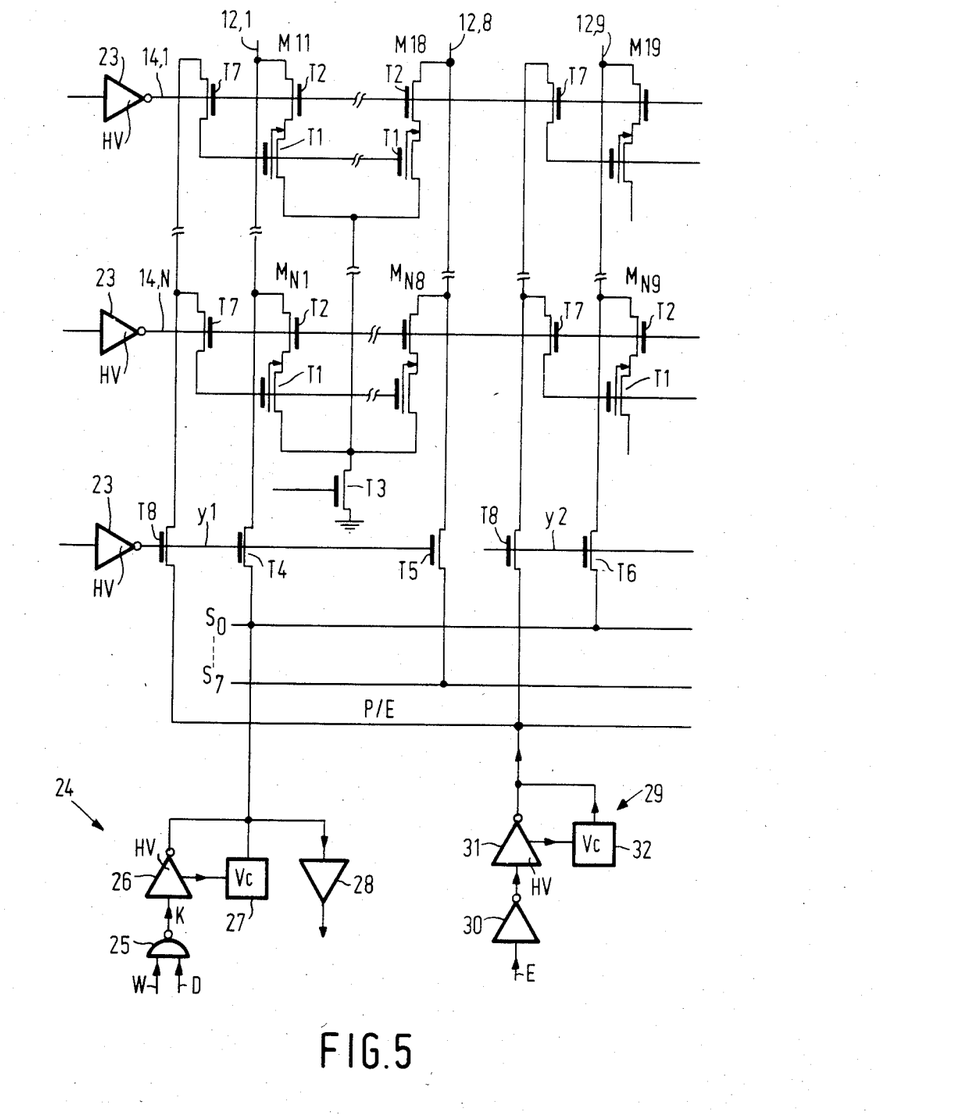
FIG. 5 shows a circuit diagram of a part of this memory together with a number of drive blocks.

FIG. 5 shows the circuit diagram of a part of the memory together with a part of the input/output electronics. The memory cells are grouped, by way of example in words (bytes) of eight bits indicated by $M_{11} \ldots M_{18}$ and $M_{N1} \ldots M_{N8}$. Each memory cell comprises a memory transistor $T_1$, the floating gate of which is provided with an arrow as a symbol for the coupling of a floating gate to the drain zone of this transistor via the thin tunnel oxide. The drain zones of the memory transistors are connected to the selection transistors $T_2$, whose gates are connected to the word lines (14,1 . . . 14,N) which are driven by inverters 23, which can bring their output to a high voltage (HV). The construction of these inverters will be described hereinafter. The source zones of the transistors $T_1$ are connected in common via the transistor $T_3$ to ground. By this transistor the source zones of the memory transistors can be rendered floating.

The (vertical) bit lines 12,1 . . . 12,8 and 12,9 are connected via the field effect transistors $T_4 \ldots T_5, T_6$ to the reading lines $S_0 \ldots S_7$. The gate electrodes of these transistors are connected to y selection lines $y_1, y_2$, etc., which are each driven by an inverter 23.

The gate electrodes 20,1 . . . 20N, which are common to the cells of one word, are connected via the transistor $T_7$, which is driven by the word lines 14, and the transistors $T_8$, which is driven by the lines $y_1, y_2$ to the lines P/E.

The reading lines $S_0 \ldots S_7$ are connected to input/output blocks 24, of which for the sake of clarity only the block 24 connected to the line $S_0$ is shown in FIG. 5. The block 24 comprises as its input a NOT-AND (NAND) gate 25, to the input of which can be supplied the writing signal W and the data D to be introduced. The output of the gate 25 is connected to an inverter 26, by means of which a high voltage HV can be supplied to the line $S_0$ and a gate signal can be supplied to the block 27 which supplies a—low—reading voltage $V_c$ to $S_O$. The line $S_O$ further connected to the input of a current detection circuit 28 for reading the stored information. The reading voltage generator 27 and the current detection amplifier 28 may be combined, if desired, into a common circuit.

The line P/E is connected to the block 29. This block comprises a first inverter, 30, to which the erasing signal E can be supplied. The output of the inverter 30 is connected to the input of a second inverter 31, by which a high voltage HV can be supplied to the line P/E. The inverter 31 is moreover connected to a voltage generator 32, by which, depending upon the output signal supplied by the inverter 30, the reading voltage $V_c$ may be supplied to the line P/E.

As stated, memories of the kind described herein are generally provided with a charge pump or voltage multipliers in order to generate the high voltage (on the order of 20 V) which is required for programming and/or erasing. This affords the advantage for the user that the usual 5 V supply voltage which is required to operate the normal C-MOS logic is sufficient. The inverters 23, 26 and 31 therefore require special buffer stages which render it possible to pass from the normal logic voltages (0 and 5 V for C-MOS) to the much higher programming voltages. These buffers are not or substantially not allowed to draw direct current from the charge pump.

Figure 6:
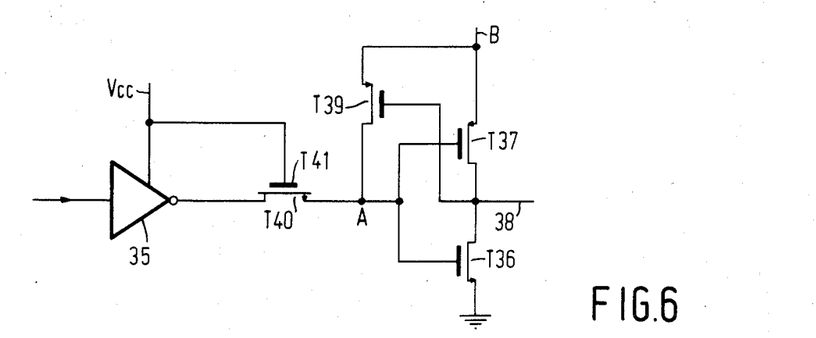
FIG. 6 shows the electric circuit diagram of a buffer circuit for the inverter 23 of FIG. 5.

FIG. 6 shows the circuit diagram of a high-voltage buffer which can be used to pass from low to high voltage without direct current flowing. The buffer, which is manufactured in C-MOS technique, comprises an inverter 35, which is operated at a low supply voltage $V_{CC}$. For this purpose, a conventional C-MOS inverter can comprise a p-channel transistor, whose source is connected to the supply $V_{CC}$, and an n-channel transistor, whose source is connected to ground. The output of the inverter 35 is connected to to the input (point A) of a second inverter comprising an n-channel transistor 36, whose source is connected to ground, as well as a p-channel transistor 37, whose source is connected to the point B. The voltage applied to the point B can vary (FIG. 7) between $V_{CC}$ and $V_H$. The output signal can be derived at the output 38. Via the p-channel transistor 39, the output 38 is fed back to the junction A in order to avoid, during operation, the flow of direct current through the inverter 36, 37. In order to avoid current flowing away from the point A, which can be connected via the transistor 39 to the high voltage $V_H$, via the inverter 35, there is connected between the point A and the output of the inverter 35 an n-channel transistor 40, whose gate electrode 41 is connected to $V_{CC}$.

Figure 7:
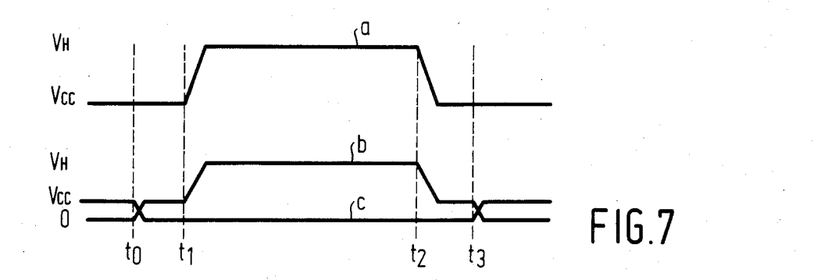
FIG. 7 shows voltage profiles as a function of the time t of voltages applied to the buffer shown in FIG. 6.

For explanation of the operation of the buffer shown in FIG. 6, FIG. 7 shows a time diagram of voltages which can be applied to various points of the circuits. The curve a represents the voltage of the point B; the curve c represents the output voltage of the inverter 35. The curve b represents the output voltage at the output 38. By way of example, FIG. 7 starts from the situation in which the inverter 35 gives off a voltage $V_{CC}$ (logic "1") and the low supply voltage $V_{CC}$ is applied to the point B. The transistor 40 is cut off and the point A is connected to the voltage $V_{CC}$ because $T_{39}$ is conducting (point 38 at zero volt). At $t_0$, the output signal fo the inverter 35 decreases to earth. Since the transistor 40 becomes conducting, the point A also is connected to zero (ground) (on the assumption that $T_{39}$, which is still conducting, is very small so that it has a high resistance), as a result of which the transistor 36 is cut off and the p-channel transistor 37 becomes conducting. The voltage at the output 38 increases to $V_{CC}$, as a result of which $T_{39}$ is cut off. At $t_1$, the voltage at the point B increases from $V_{CC}$ to $V_H$ (for example 20 V). Via the conducting transistor $T_{37}$, the output 38 is charged to $V_H$. When then (at $t_2$) $V_B$ again decreases to $V_{CC}$, the output voltage also decreases to $V_{CC}$. At $t_3$, the input signal of the inverter 35 decreases to 0 V, as a result of which the output of the inverter 35 increases to $V_{CC}$. The potential at the junction A increases to $V_{CC} - V_{TH}$, $V_{TH}$ being the threshold voltage of $T_{40}$. The transistor 37 is at least substantially entirely cut off and the transistor 36 becomes conducting so that the potential at the output 38 decreases to 0 V, as a result of which the p-channel transistor 39 becomes conducting and the point A is further charged to $V_{CC}$, while $T_{40}$ and $T_{37}$ are entirely cut off. If now the voltage at the point B should be brought again to $V_H$ by the charge pump, the point A is also charged via the transistor 39 to the value $V_H$. The voltage difference $V_{gs}$ between the source of the transistor 37 and the gate thus remains below the threshold voltage of this transistor so that this transistor does not become conducting. At the same time, the $V_{gs}$ of the transistor 40 also remains below the threshold voltage so that current cannot flow via the transistors 39 and 40 from the point B to the inverter 35. Thus, the feedback via the transistor 39 prevents the flow of direct current through the buffer.

The inverters 23 can be composed of a buffer as shown in FIG. 6, while the inverter 35 can be replaced by NAND, NOR or other logic C-MOS blocks of the peripheral circuits.

Figure 8:
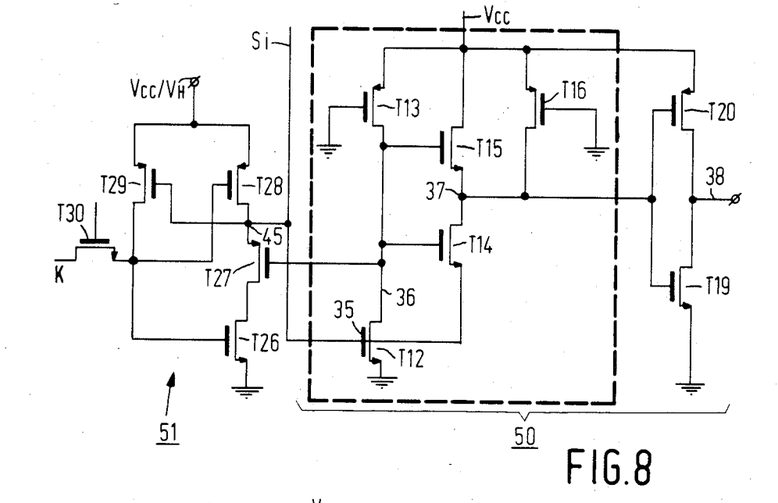
FIG. 8 shows the electric circuit diagram of the blocks 26, 27 and 28/30 in FIG. 5.

FIG. 8 shows the circuit diagram of the buffer 26 and of the reading voltage source 27, which in the present embodiment is combined with the detector circuit 28 in a constructional unit in the form of the block 50. The part of the block 50 enclosed in FIG. 8 by broken lines is of the same type as the reading amplifier described in the article "An 8k EEPROM Using the Simos Storage Cell" of B. Giebel, published in I.E.E.E. Journal of Solid State Circuits, Vol. SC-15, Nr. 3, June 1980, p. 311/315, notably FIG. 6, and the associated description. The amplifier comprises an n-type channel input transistor $T_{12}$, whose source zone is connected to ground and whose gate electrode 5 is connected to one of the lines $S_0 \ldots S_7$. The drain of $T_{12}$ is connected via the load transistor $T_{13}$ to the supply line $V_{CC}$. For $T_{13}$ a p-channel transistor is used in this case, but it will be appreciated that it is also possible to use for $T_{13}$ an n-channel transistor of the kind described in the said publication or a resistor. The gate electrode of $T_{13}$ is connected to a fixed voltage. The output 36 of the amplifier (inverter) $T_{12}$, $T_{13}$ is connected to the gate electrodes of two series-connected n-channel transistors $T_{15}$, $T_{14}$. The source of $T_{14}$ is connected to the gate 35 of $T_{12}$, while the drain of $T_{14}$ is connected to the source of $T_{15}$. The drain of $T_{15}$ is connected to the supply line $V_{CC}$. The junction 37 between $T_{14}$ and $T_{15}$ is connected to the drain of the transistor $T_{16}$, which is connected as a resistor, whose gate is connected to a fixed potential and whose source is connected to the supply line $V_{CC}$. Instead of the p-channel transistor $T_{16}$ used in this case, it is alternatively possible to use, as in the aforementioned publication, an n-channel transistor, whose gate is connected to $V_{CC}$.

For the operation of the circuit comprising the transistors $T_{12}-T_{16}$, reference may be made to the previously mentioned publication of B. Giebel. In principle, operation is based on the fact that, when the cell to be read is in a non-conducting state, so low a current is required that this current can be supplied entirely by the transistor $T_{16}$ and is conducted via $T_{14}$ to the connected line $S_i$. In the case in which the cell to be read is conducting and requires much more current, an associated reduction of the voltage at the gate 35 will be inverted and passed via the connection 36 to the gate of T$_{15}$, as a result of which the latter transistor becomes conducting. The current necessary to keep the voltage at the gate 35 and the connected line S$_i$ constant at a desired voltage V$_C$ (determined by the size of the various transistors) can be supplied by T$_{15}$.

The voltage variation occurring in these states at the junction 37 can be detected by the inverter stage T$_{19}$, T$_{20}$ comprising an n-channel transistor T$_{19}$, whose source is connected to ground (negative supply line), and a p-channel transistor T$_{20}$, whose source is connected to the positive supply line V+. The drain zones of the transistors T$_{19}$ and T$_{20}$ are connected to the output 38, at which the output signal can be derived.

The buffers (inverters) 26 and 31 of FIG. 5 are represented in FIG. 8 by the circuit 51. This buffer differs from the output stage of the buffer shown in FIG. 6 in that in this case the p-channel transistor T$_{27}$ is interposed between the output and the n-channel transistor T$_{26}$. This transistor has to ensure that, when the gate signal k, which is supplied via T$_{30}$, amounts to 5 V, the output 45 of the buffer, which is connected to the line S$_i$, is not discharged to 0 V. In fact, when the output 45 is discharged to such an extent that V$_g$ of T$_{27}$ is smaller than its threshold voltage, T$_{27}$ is cut off and the voltage at the output 45 is determined by the block 50.

Figures 9, 10, 11:
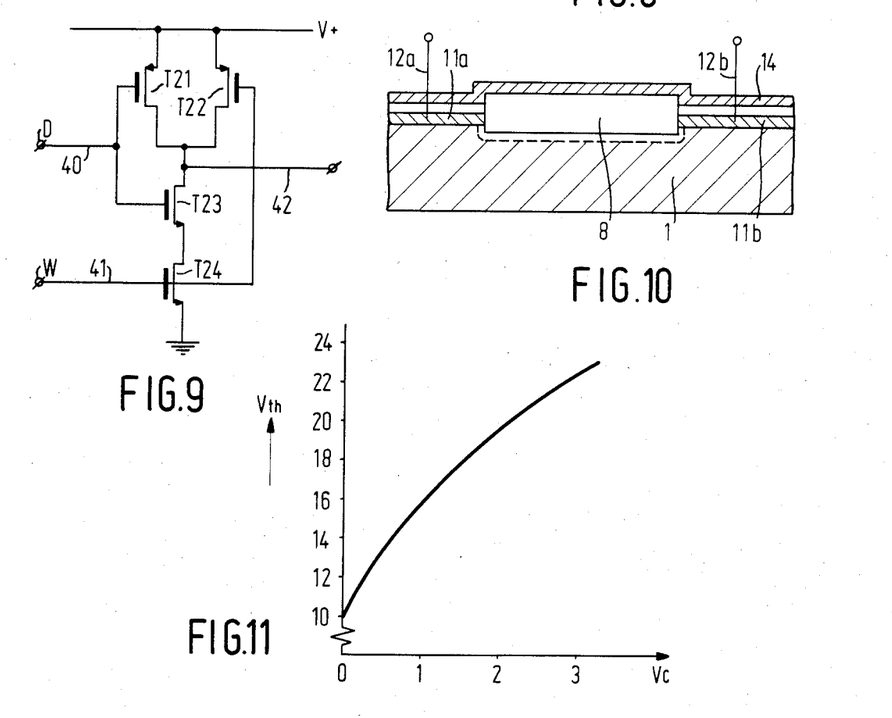
FIG. 9 shows the circuit diagram of the NAND gate 25 in FIG. 5.
FIG. 10 is a sectional view of a parasitic transistor taken on the line X—X in FIG. 1.
FIG. 11 shows the relation between the threshold voltage of the parasitic transistor shown in FIG. 10 and the voltage at the source of this transistor.

FIG. 9 shows the circuit diagram of a possible embodiment of the NAND gate 25 of FIG. 5. The gate comprises two parallel-connected p-channel transistors T$_{21}$ and T$_{22}$, whose source zones are connected to the positive supply line V+. The drain zones are connected to the drain of the n-channel transistor T$_2$, whose source is connected to the drain of the n-channel transistor T$_{24}$. The source of T$_{24}$ is connected to ground. The gate electrodes of T$_{21}$ and T$_{23}$ are interconnected and form an input 40 for information representing input signals D. The gate electrodes of T$_{22}$ and T$_{24}$ are also interconnected and form an input 41 for supplying writing signals W. The output signals are devied at the output 42 at the junction between the drain zones of T$_{21}$, T$_{22}$ on the one hand and T$_{23}$ on the other hand.

The device described here can be operated as follows. During reading, the gate signals W=0 and D=0 are supplied to the NAND gate 25. The output signal K is then "1". Therefore, the reading voltage V$_C$ (for example 2 V) is applied to the selected line S$_i$. A signal E=0 is supplied to the inverter 30 so that the voltage V$_C$ supplied by the unit 32 is also applied to the line P/E. Via the transistors T$_4$, T$_5$, the voltage V$_C$ is supplied to the drain of the transistors T$_2$ of the selected word. At the same time, the voltage V$_C$ is also supplied via the transistors T$_7$ and T$_8$ to the gate electrodes of the selected memory transistors T$_1$. Depending upon the information that is stored in the cell to be read, current can or cannot flow through the cell. This current can be converted by the unit 27, 28 into a voltage and can be detected.

During writing, the source zones of the memory transistors can be applied to a floating potential by cutting off the transistors T$_3$ (FIG. 5). The writing signal W=1 is supplied to the NAND gate 25 and the signal E=0 is supplied to the inverter 30. Therefore, again the voltage V$_C$ is applied to the line P/E. The voltage supplied to S$_i$ depends upon the data signal D. In the case in which D=1, an output signal K=0 is given off by the NAND gate 25. The connected line S$_i$ is charged by the buffer 26 to the high voltage level HV (for example 20 V). A voltage of HV-V$_{th}$ is then applied to the drain of the selected memory transistor and the voltage V$_C$ is applied to the gate electrode of this transistor. The cell is then written in such that positive charge is provided at the floating gate, as a result of which the threshold voltage passes to a low level. In the case in which D=0, K=1 and V$_C$ is applied to the drain of the relevant memory transistors. In this case the content of the cell is not modified.

During erasing, W and D=0 and E=1. The reading voltage V$_C$ is applied to the line S$_i$ and this voltage is also applied to the drain of the memory transistor. Simultaneously, the line P/E is charged to the high voltage level HV. This high voltage minus one threshold voltage is supplied to the gate electrode of the memory transistor. Due to the strong capacitive coupling between the floating gate and the gate electrode, the floating gate also receives a high positive voltage with respect to the drain. Due to the thin tunnel oxide 18, a strong electrical field is produced, as a result of which electrons can tunnel from the zone 16 (FIG. 3) to the floating gate 17 and the floating gate 17 is provided with a negative charge. The threshold voltage of the relevant transistor increases in this situation to a high value, as a result of which at usual voltages the transistor will no longer draw current during reading.

In order to illustrate the effect of the invention, FIG. 10 shows a diagrammatic sectional view of a part of the memory taken on the line X—X in FIG. 1. This part mainly comprises the region beneath a word line 14 between two adjacent cells of the same word. In the drawing, a word line 14 is indicated, which mainly extends over the thick oxide 8, and broken lines indicate the drain regions 11a and 11b of the transistors T$_2$ of the two adjacent cells together with the connections 12a and 12b shown diagrammatically. The remaining parts are not shown in FIG. 10 for the sake of clarity. A similar second parasitic element is present between the transistors 7 (FIG. 5) and the transistors T$_2$ of the first column. It is assumed that both cells are erased and that the cell, of which the zone 11a forms part, has to be written and that the content of the cell, of which the zone 11b forms part, has to remain unchanged. V$_C$ is applied to the common gate electrode 20 associated with this word and the high voltage VH is applied to the drain zones 4, 11a of the lefthand cell in FIG. 10. In order to avoid a change of the information in the righthand cell in FIG. 10, the low voltage V$_C$ is applied to the drain 11b via the bit line 12b. The voltage HV is also applied to the word line 14 in order that the zone 11a can be increased to approximately the voltage HV. In this situation, the parasitic MOS transistor shown in FIG. 10 comprising the zone 11a as a drain, the zone 11b as a source, the word line 14 as a gate electrode and the field oxide 8 as a gate dielectric can play a part. The threshold voltage of a MOS transistor can generally be described by the equation: $V_{th}=V_{FB}+2\phi_f+k\sqrt{2\phi_f}$ in case no voltage is applied between the source zone and the substrate. In this equation V$_{FB}$ represents the flat band voltage which is equal to $\phi_{MS}$ (the work function difference between the gate electrode and the silicon) minus Q$_{ox}$/C$_{ox}$, where Q$_{ox}$ represents the oxide charge and C$_{ox}$ represents the oxide capacitance. The quantity $\phi_f$ represents the Fermi potential of the semiconductor material which depends upon the doping concentration. The quantity k is designated as the "body factor" and is equal to $$\frac{\sqrt{2qN\epsilon}}{C_{ox}}$$

where q is the elementary quantity of charge, N is the substrate doping and $\epsilon$ the dielectric constant of the substrate. By means of the above equation, it can be calculated that for p-type substrates having a usual doping and an oxide thickness of 0.5 μm the threshold voltage of the parasitic field effect transistor shown in FIG. 10 is about 10 to 12 V.

In order to obtain a maximum electrical field across the tunnel oxide 18, it is usual to correct both the gate electrode 20 and the zone 11b to ground potential. In this situation, both parasitic transistors can become conducting and therefore draw current. This current has to be supplied by the charge pump, which serves to generate the high voltage. Due to the comparatively large parasitic leakage currents, the voltage generated by the charge pump will often be considerably smaller than was originally expected. When according to the invention, instead of ground potential, the comparatively small reading voltage $V_C$ is applied to the zone 11b and the gate electrode 20, this disadvantage can be eliminated for the major part. The threshold voltage of the MOS transistor shown in FIG. 10 now becomes $V_{th} = V_{FB} + 2\phi_f + k\sqrt{2\phi_f + V_C}$.

FIG. 11 shows the variation of $V_{th}$ as a function of $V_C$ for the parasitic MOS transistor shown in FIG. 10. The k factor for this transistor is about 12½ V, which high value is especially due to the low value of $C_{ox}$. Due to the high k factor, $V_{th}$ rapidly increases as a function of $V_C$. In the embodiment described here, a value of $V_C$ of 2 V (reading voltage) suffices to obtain a parasitic threshold voltage of about 20 V. When therefore during writing the voltage $V_C$ is applied to the gate electrode 20, as a result of which in the first instance the field across the tunnel oxide is reduced, it is possible to suppress the formation of parasitic channels. Consequently, in practice the charge pump can generate higher voltages than in the conventional mode of operation, as a result of which the said small voltage loss across the tunnel oxide can be amply compensated for.

Problems of the kind mentioned above for the writing modes can also arise during erasing under given conditions, during which latter process the electric field is applied across the tunnel oxide by applying the high voltage to the gate electrodes 20 and a low voltage to the zones 11, 4, 16. In this situation the said second parasitic element between the transistor $T_7$ and the transistors $T_2$ of the first column in FIG. 5 can be prevented from becoming operative in that according to the invention, instead of ground potential, the low reading voltage $V_C$ is supplied to the zones 11, 4, 16.

It will be appreciated that the invention is not limited to the embodiment described herein, but that many variations are possible for those skilled in the art without departing from the scope of the invention. For example, the invention may also be used in memories in which the floating gate is not charged or discharged by means of the tunnel mechanism, but in which the charge transport takes place by means of hot charge carriers, which are obtained by avalanche breakdown. The invention may further be used in memories in which the information storage region is constituted not by a floating gate, but by an interface layer between two different dielectrics, such as silicon oxide and silicon nitride.

In the embodiment described above, also other drive blocks than the blocks described may be used. Furthermore, all conductivity types may be inverted.

The invention may also be used advantageously in EPROMS, in which the writing operation takes place in a manner similar to that described above, but in which the erasing operation is carried out by means of irradiation, for example, with U.V. radiation.

What is claimed is:

1. A semiconductor device comprising a semiconductor body having a major surface, a non-volatile memory at said surface and having a plurality of memory cells, each memory cell comprising an insulated gate field effect transistor having a channel region, an insulating layer covering said channel region, a charge storage region defined in said insulating layer, the threshold voltage of said transistor being determined by the electrical charge stored in said charge storage region, said transistor further comprising a gate electrode which is capacitively coupled to said charge storage region and source and drain zones of a first conductivity type, a layer-shaped part of the semiconductor body of the second conductivity type surrounding said source and drain zones, a p-n junction separating said source and drain zones from said layer-shaped part of the second conductivity type, means for applying a voltage to said layer-shaped part of the semiconductor body during operation, a conductive region adjoining said insulating layer, and means for applying a voltage difference between said gate electrode and said conductive region during at least one of erasing and writing such that an electrical field is produced across said insulating layer so that a charge flow can occur between said charge storage region and said conductive region, means for applying an at least substantially constant voltage to at least one of the source and drain zones of the transistor during at least one of erasing and writing such that the p-n junction between said at least one zone and the layer-shaped part of the semiconductor body is reversely biased during the whole of said at least one erasing or writing cycle to avoid the formation of parasitic channels adjoining said at least one zone, said voltage across said last-recited p-n junction being lower than said voltage difference which is applied between the gate electrode and the conductive region for producing the charge flow between the charge storage region and the conductive region.

2. A semiconductor device as claimed in claim 1, characterized in that during at least one erasing and writing the same voltage is applied to said zone as during reading, in order to prevent the formation of parasitic channels adjoining that zone.

3. A semiconductor device as claimed in claim 1, or claim 2, characterized in that the conductive region adjoining the insulating layer is a a substrate region of the semiconductor body located under the charge storage region.

4. A semiconductor device as claimed in claim 3, characterized in that the charge storage region comprises a floating gate electrode, which is embedded in the insulating layer between the gate electrode and the surface of the semiconductor body and extends above one of the source and drain zones of the transistor, which zone also comprises said substrate region which is used for applying at least one of an erasing voltage and a programming voltage.

5. A semiconductor device as claimed in claim 4, characterized in that the floating gate is separated from said zone by an insulating layer which is so thin that at least one of writing and erasing takes place at least substantially via quantum tunnelling mechanisms.

6. A semiconductor device as claimed in claim 2, characterized in that means are provided by which the other zone of the transistor is caused to float electrically during at least one of erasing and writing.

* * * * *